United States Patent
Ueda (10) Patent No.: US 10,714,202 B2
(45) Date of Patent: Jul. 14, 2020

(54) MAGNETIC MEMORY

(71) Applicant: Toshiba Memory Corporation, Tokyo (JP)

(72) Inventor: Yoshihiro Ueda, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/290,571

(22) Filed: Mar. 1, 2019

(65) Prior Publication Data
US 2020/0090775 A1 Mar. 19, 2020

(30) Foreign Application Priority Data

Sep. 18, 2018 (JP) .................................. 2018-174070

(51) Int. Cl.
| | |
|---|---|
| *G11C 19/08* | (2006.01) |
| *H01L 43/02* | (2006.01) |
| *H01L 27/22* | (2006.01) |
| *H01L 43/10* | (2006.01) |

(52) U.S. Cl.
CPC ........ *G11C 19/0841* (2013.01); *H01L 27/222* (2013.01); *H01L 43/02* (2013.01); *H01L 43/10* (2013.01)

(58) Field of Classification Search
CPC ... G11C 19/0841; H01L 27/222; H01L 43/02; H01L 43/10
See application file for complete search history.

(56) References Cited

U.S. PATENT DOCUMENTS

| | | | |
|---|---|---|---|
| 8,320,152 B2 * | 11/2012 | Cho | G01R 33/12 365/171 |
| 8,625,335 B2 | 1/2014 | Morise et al. | |
| 9,293,696 B2 | 3/2016 | Ootera et al. | |
| 9,396,811 B2 | 7/2016 | Ootera et al. | |
| 10,446,212 B2 * | 10/2019 | Hashimoto | H01L 43/02 |
| 2015/0232702 A1 * | 8/2015 | Yamaguchi | C09D 183/14 427/255.28 |
| 2016/0224242 A1 * | 8/2016 | Kondo | G06F 3/061 |
| 2017/0179376 A1 * | 6/2017 | Nakamura | H01L 29/82 |

(Continued)

FOREIGN PATENT DOCUMENTS

JP 2016009806 A 1/2016

OTHER PUBLICATIONS

U.S. Appl. No. 16/114,162, filed Aug. 27, 2018.

*Primary Examiner* — Toan K Le
(74) *Attorney, Agent, or Firm* — Kim & Stewart LLP (57) ABSTRACT

A magnetic memory included a conductive line that extends in a first direction along a substrate. A first columnar body is in a memory cell array region of the substrate and extends in a second direction from the substrate. A first end of the first columnar body contacts the conductive line. The first columnar body is comprised of a first magnetic material and has magnetic domains adjacent to one another along a length of the first columnar body in the second direction. A second columnar body is in a peripheral region of the substrate and extending in the second direction from the substrate. A first end of the second columnar body contacts the conductive line, and a second end is connected to a control circuit. The second columnar body also is comprised of the first magnetic material.

22 Claims, 5 Drawing Sheets

(56) References Cited

U.S. PATENT DOCUMENTS

| | | | |
|---|---|---|---|
| 2017/0229640 A1* | 8/2017 | Kado | G11C 11/1675 |
| 2019/0088712 A1* | 3/2019 | Kado | H01L 27/226 |
| 2019/0287593 A1 | 9/2019 | Ueda | |
| 2019/0287598 A1* | 9/2019 | Shimada | H01F 10/3254 |
| 2019/0287637 A1* | 9/2019 | Quinsat | H01L 43/02 |

* cited by examiner

MAGNETIC MEMORY

CROSS-REFERENCE TO RELATED APPLICATION

This application is based upon and claims the benefit of priority from Japanese Patent Application No. 2018-174070, filed Sep. 18, 2018, the entire contents of which are incorporated herein by reference.

FIELD

Embodiments described herein relate generally to a magnetic memory.

BACKGROUND

In a magnetic memory, a plurality of columnar bodies including magnetic material are arranged to form a memory cell array. It is desirable to fabricate the magnetic memory at lower cost.

DETAILED DESCRIPTION

In general, according to one embodiment, a magnetic memory comprises a conductive line that extends in a first direction along a substrate. A first columnar body is in a memory cell array region of the substrate and extends in a second direction from the substrate. A first end of the first columnar body contacts the conductive line. The first columnar body comprises a first magnetic material and a plurality of magnetic domains adjacent to one another along a length of the first columnar body in the second direction. A second columnar body is in a peripheral region of the substrate and extends in the second direction from the substrate. A first end of the second columnar body contacts the conductive line, and a second end is connected to a control circuit. The second columnar body comprises the first magnetic material.

Hereinafter, a magnetic memory according to an example embodiment will be described in detail with reference to the attached drawings. It should be noted that the present disclosure is not limited by this example embodiment.

In a magnetic memory according to an embodiment, a plurality of columnar bodies of magnetic material are arranged in a memory cell array region and form a memory cell array. In this embodiment, the magnetic memory is a domain-wall type in which in which a particular domain in the column stores data by use of different magnetization directions, then the particularly magnetized domain is pushed/shifted to another domain by application of a shift current to the magnetic material column. After shifting, the next data can be stored in the particular domain and the shifting may be repeated until every domain along the column length has been written. The magnetic memory shifts the magnetic domain data along the magnetic material columns by applying a shift current and reads data by detecting a magnetization direction of the domain of the magnetic material column at a read position. For this reason, control circuits for applying shift currents to both ends of each magnetic material are used in the magnetic memory of this type.

In a manufacturing of a magnetic memory of this type, the control circuits for applying the shift current may be damaged during the forming of the magnetic material columns when the control circuit is provided underneath the magnetic material columns. The control circuit may be damaged during manufacturing by, for example, an anodic oxidation process, which is used to form the columns, that is also accompanied by a high electric field. The control circuit may be instead provided above the plurality of magnetic material columns that form the memory cell array. In a peripheral region located outside the memory cell array region, a multi-level plug may be utilized as a wire for connecting to the control circuit from the lower end of the magnetic material column to the upper end. When the plug in the peripheral region is formed of a conductive material such as tungsten, it is necessary to form the plug in the peripheral region and form the plurality of magnetic material columns in the memory cell array region by distinct processes, and thus the manufacturing cost of the magnetic memory may increase.

The present embodiment forms a magnetic memory at lower cost by using a magnetic material column in the formation of a plug and thus a common process can be used to form magnetic material columns ultimately used as plugs in the peripheral region and the magnetic material columns used for memory cells in the memory cell array region.

A magnetic memory is formed as follows. A conductive line (source line) that extends in a first direction along a substrate extends from the memory cell array region to the peripheral region. First magnetic material columns are arranged in the memory cell array region, and second magnetic material columns are arranged in the peripheral region. The first magnetic material columns and the second magnetic material columns include the same magnetic material. The first magnetic material columns and the second magnetic material columns may have heights from the substrate that are equal to each other. The lower ends of the first magnetic material columns are electrically connected to the conductive line and the lower ends of the second magnetic material columns are also electrically connected to the conductive line. The upper ends of the first magnetic material columns are electrically connected to a first control circuit via plugs, other conductive lines (e.g., bit lines) and conductive pads (e.g., electrodes), and the upper ends of the second magnetic material columns are electrically connected to a second control circuit via plugs and conductive pads (e.g., electrodes). Accordingly, the first magnetic material columns and the second magnetic material columns can be formed by a common process at the same time. Therefore, a configuration in which shift currents are applied across the first magnetic material columns from a first control circuit and a second control circuit can be achieved at low cost via use of the second magnetic material columns to connect the lower ends of the first magnetic material columns to the second control circuit via the source line or the like.

Figure 1:
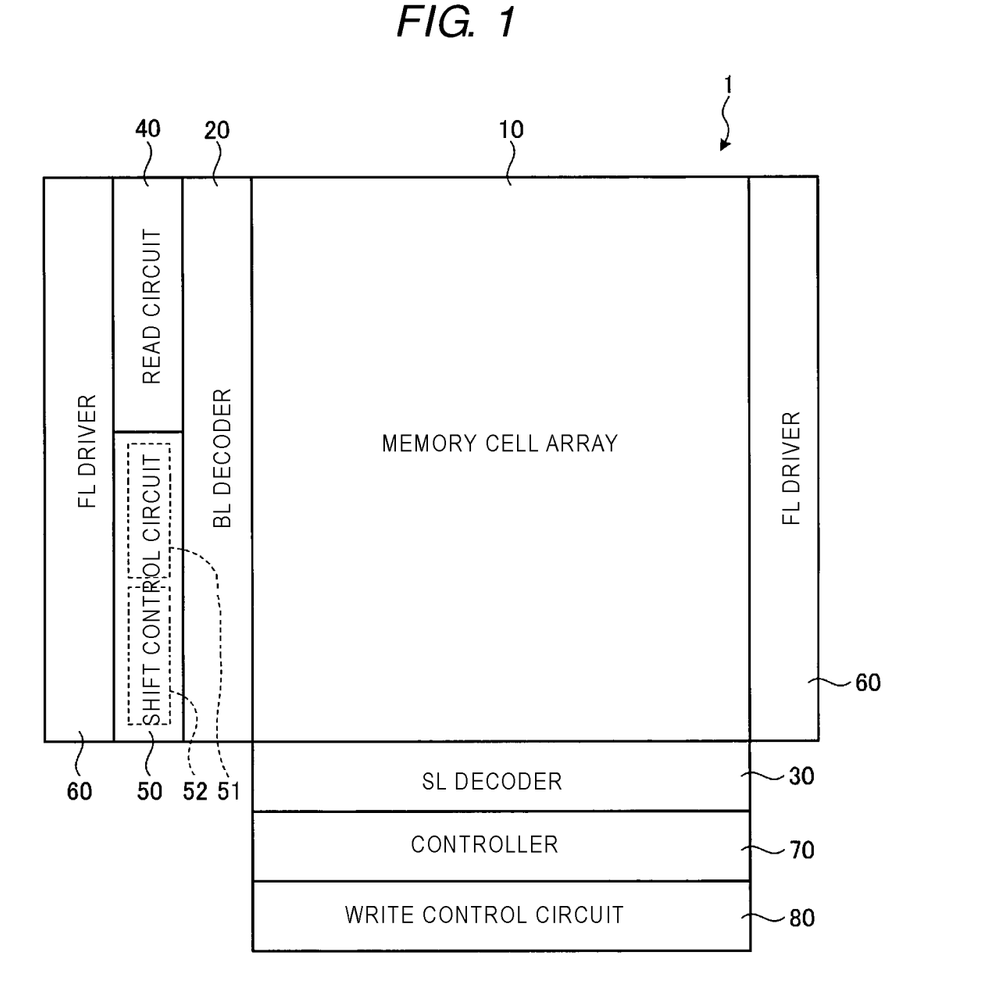
FIG. 1 is a block diagram of a magnetic memory according to an embodiment.

More specifically, a magnetic memory 1 may be configured as shown in FIG. 1. FIG. 1 is a block diagram showing a configuration of a magnetic memory 1.

The magnetic memory 1 shown in FIG. 1 includes a memory cell array 10, a bit line (BL) decoder 20, a source line (SL) decoder 30, a read circuit 40, a shift control circuit 50, a field line (FL) driver 60, a write control circuit 80, and a controller 70. The shift control circuit 50 includes a first control circuit 51 and a second control circuit 52.

The memory cell array 10 includes a plurality of magnetic material columns MML1. Each magnetic material column MML1 includes a plurality of magnetic domains for storing data arranged along the column length. In the memory cell array 10, the magnetic material columns MML1 are arranged in a matrix form. Each magnetic material column MML1 is electrically connected between a bit line BL and a source line SL. The magnetic material column MML1 may also be called a nanoscopic magnetic wire or a magnetic storage domain nanowire.

The bit line (BL) decoder 20 selects a bit line BL from a plurality of bit lines BL based on a row address. The source line decoder 30 selects a source line SL from a plurality of source lines SL based on a column address. The write control circuit 80 writes data to the magnetic material column in the memory cell array 10. During writing, the field line driver 60 applies a current to a field line FL under the control of the write control circuit 80 and generates an induced magnetic field corresponding to the write data with the field line. The read circuit 40 includes a sense amplifier and reads data from the magnetic material columns in the memory cell array 10.

In the write operation and the read operation the first control circuit 51, the second control circuit 52, and the shift control circuit 50 more generally to apply a voltage to the magnetic material column and output a shift current to shift each magnetic domain in the magnetic material column MML1 to a next position along the column length. The first control circuit 51 is configured to electrically connect to an upper end of the magnetic material column MML1 via the bit line BL. The second control circuit 52 is configured to electrically connect to a lower end of the magnetic material column MML1 via a magnetic material column MML2 and the source line SL.

Figure 2:
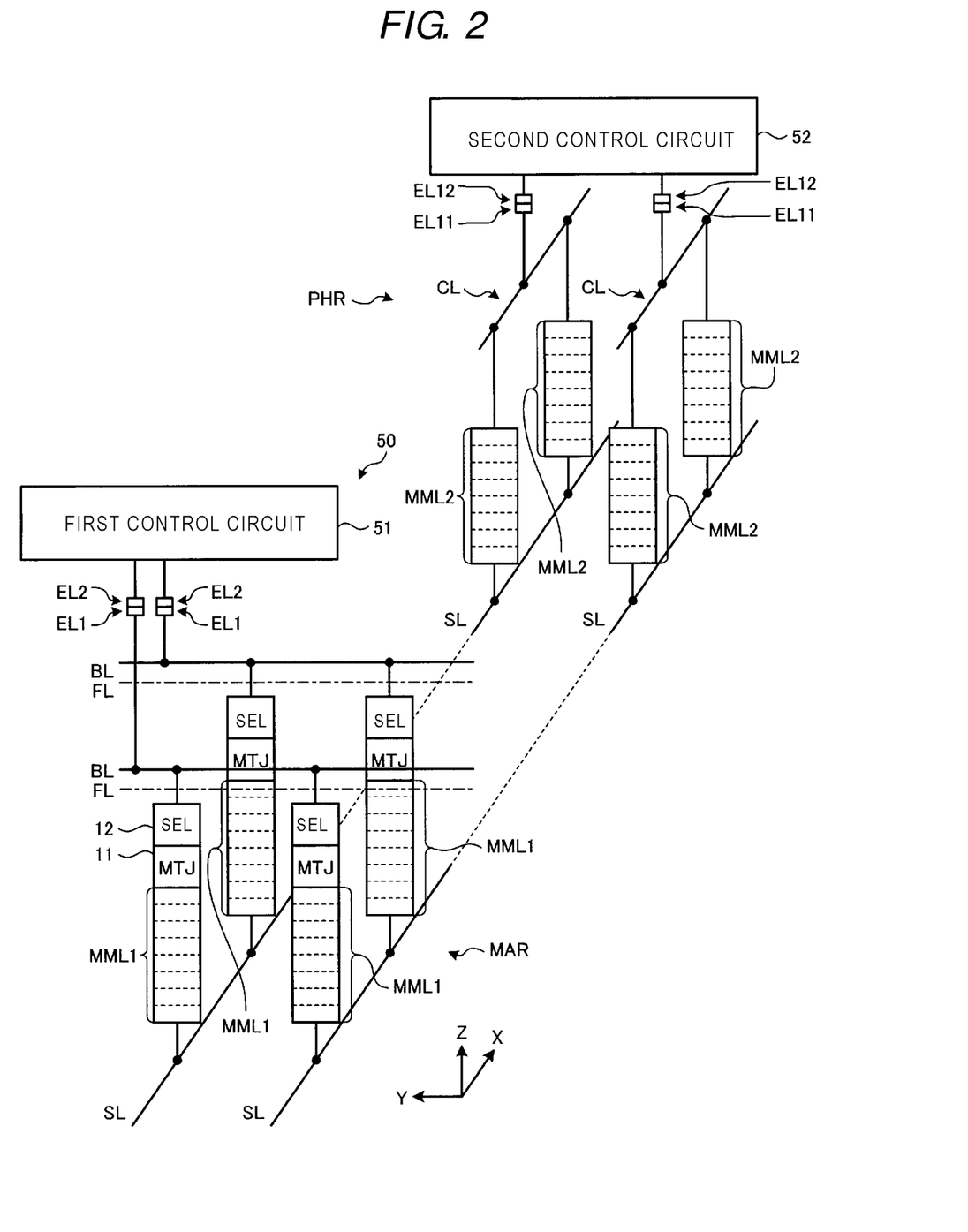
FIG. 2 is a schematic circuit diagram of a memory cell array region and a peripheral region in an embodiment.

A substrate on which the magnetic memory 1 is mounted includes a memory cell array region MAR and a peripheral region PHR. The memory cell array region MAR is a region where the memory cell array 10 is disposed and the peripheral region PHR is a region located around the memory cell array region MAR. A circuit configuration of the memory cell array region MAR and the peripheral region PHR may be as shown in FIG. 2, for example. FIG. 2 is a circuit diagram showing a configuration of the memory cell array region MAR and the peripheral region PHR. In FIG. 2, the direction perpendicular to a surface 1011 of a substrate 101 (see FIG. 4) is defined as a Z direction, and two directions orthogonal to each other in a plane perpendicular to the Z direction are defined as an X direction and a Y direction.

As shown in FIG. 2, a plurality of source lines SL are disposed across the memory cell array region MAR and the peripheral region PHR. Each source line SL is arranged at a predetermined pitch in the Y direction and extends from the memory cell array region MAR to the peripheral region PHR along the X direction.

In the memory cell array region MAR, the plurality of bit lines BL and a plurality of field lines FL are disposed on the +Z side of the plurality of source lines SL. The plurality of bit lines BL intersect the plurality of source lines SL when viewed from the Z direction. Each bit line BL is arranged with a predetermined pitch in the X direction and extends in the Y direction. Each field line FL is arranged at a predetermined pitch in the X direction and extends in the Y direction so as to pass near the upper end of the magnetic material column MML1.

The magnetic material columns MML1 are disposed between the bit lines BL and the source lines SL in the Z direction and are arranged at XY positions where the bit lines BL and the source lines SL intersect. The magnetic material columns MML1 are arranged in a matrix on a plane in the X direction and the Y direction.

Each magnetic material column MML1 extends in the Z direction. A +Z side end of each magnetic material column MML1 is electrically connected to a bit line BL via a magnetoresistance effect element 11 and a selection element 12. The selection element 12 may be referred to as a selector (SEL) 12. The magnetoresistance effect element 11 may also be a resistance change element or a variable resistance element. The +Z side end of the magnetic material columns MML1 is electrically connected to a −Z side end of a magnetoresistance effect element 11, and a +Z side end of the magnetoresistance effect element 11 is electrically connected to a −Z side end of a selection element 12. A +Z side end of the selection element 12 is electrically connected to a bit line BL. A −Z side end of the magnetic material columns MML1 is electrically connected to a source line SL. The field line FL passes near the +Z side ends of the magnetic material columns MML1, but is not electrically connected to the magnetic material columns MML1.

The magnetoresistance effect element 11 includes, for example, a magnetic tunnel junction (MTJ) element whose resistance changes according to a magnetization state. The selection element 12 includes, for example, an element which enters a low resistance state when a voltage equal to or higher than a threshold voltage is applied and enters a high resistance state when a voltage lower than the threshold voltage is applied. The selection element 12 may be, for example, a switch element between two terminals. When a voltage applied between the two terminals is equal to or lower than a threshold voltage, the switch element is in a high resistance state, such as an electrically nonconductive state. When the voltage applied between the two terminals is equal to or higher than the threshold voltage, the switch element changes to a low resistance state or an electrically conductive state. The switch element may have such a switching function for either polarity of voltage that might be applied. The switch element in this example contains at least one chalcogen element selected from the group consisting of tellurium (Te), selenium (Se), and sulfur (S). Alternatively, the switch element may contain a chalcogenide which is a compound containing a chalcogen element. In some examples, the switch element may contain at least one element selected from a group consisting of boron (B), aluminum (Al), gallium (Ga), indium (In), carbon (C), silicon (Si), germanium (Ge), tin (Sn), arsenic (As), phosphorous (P), and antimony (Sb).

For example, the magnetic material columns MML1, magnetoresistance effect elements 11, and selection elements 12 at positions that have substantially the same X coordinate are connected to the same bit line BL. On the other hand, the magnetic material columns MML1, magnetoresistive effect elements 11, and selection elements 12 at positions that have substantially the same Y coordinate are connected to the same source line SL.

In the memory cell array region MAR, a plurality of electrodes EL1, a plurality of electrodes EL2, and the first control circuit 51 are disposed above (on the +Z side) the plurality of bit lines BL. Each electrode EL1 is electrically connected to a corresponding bit line BL. Each electrode EL2 contacts a surface (on the +Z side) of a corresponding electrode EL1 and is electrically connected to the corresponding electrode ELL The first control circuit 51 is disposed above (on the +Z side) the plurality of electrodes EL2 and is electrically connected to the plurality of electrodes EL2.

In the peripheral region PHR, a plurality of connection lines CL are disposed above (on the +Z side) the plurality of source lines SL. The plurality of connection lines CL overlap the plurality of source lines SL when viewed from the Z direction. A plurality of magnetic material columns MML2 are disposed between, in the Z direction, the connection lines CL and the source lines SL. The magnetic material columns MML2 are arranged in a matrix form on a plane formed in the X direction and the Y direction.

Each magnetic material column MML2 extends in the Z direction. A +Z side end of the magnetic material columns MML2 is electrically connected to a connection line CL, and a −Z side end of the magnetic material columns MML2 is electrically connected to a source line SL.

That is, the magnetic material columns MML2 aligned in the X direction are electrically connected in parallel between a connection line CL and a source line SL. Accordingly, the magnetic use of the several material columns MML2 aligned in the X direction improves conductivity between the connection lines CL and the source lines SL.

In the peripheral region PHR, a plurality of electrodes EL11, a plurality of electrodes EL12, and the first control circuit 51 are disposed above (on the +Z side) of the plurality of connection lines CL. Each electrode EL11 is electrically connected to a corresponding connection line CL. Each electrode EL12 is in contact with a surface (on the +Z side) of the corresponding electrode EL11 and is electrically connected to the corresponding electrode EL11. The second control circuit 52 is disposed above (on the +Z side) of the plurality of electrodes EL12 and is electrically connected to the plurality of electrodes EL12.

Next, write and read operations in the magnetic memory 1 will be described. In data reading and writing to a magnetic memory 1, a magnetic domain at some position along a (magnetic material column MML1 to be read or written is shifted along the column to a position at which a mechanism for reading or writing (sometimes referred as a read/write head) can be used to read/write data from/to the magnetic domain. That is, what is sometimes referred to as a magnetic domain wall is shifted (pushed) along the column length as necessary to position the magnetic domain at a reading/writing position. The shifting of the magnetic domain wall is performed by, for example, applying a shift current to the magnetic material column MML.

For example, in a write operation, the shift control circuit 50 outputs a shift current from the second control circuit 52. In the configuration shown in FIG. 2, the shift current is transmitted through a conductance pathway of the electrode EL12 to the electrode EL11 to the connection line CL to the magnetic material column MML2 to the source line SL to the magnetic material column MML1 to the bit line BL to the electrode EL1 to the electrode EL2 to the first control circuit 51. Accordingly, a shift current is applied to the magnetic material column MML1 and the magnetic domain shifts in the +Z direction. In this way, a shift operation on each magnetic domain in the addressed magnetic material column MML1 of the write operation can be performed.

In a read operation, the shift control circuit 50 outputs a shift current from the first control circuit 51. The shift current is transmitted through a conductance pathway of the electrode EL2 to the electrode EL1 to the bit line BL to the magnetic material column MML1 to the source line SL to the magnetic material column MML2 to the connection line CL to the electrode EL11 to the electrode EL12 to the second control circuit 52. Accordingly, the shift current is applied to the magnetic material column MML1 and the magnetic domain shifts in the −Z direction. In this way, a shift operation on each magnetic domain in the addressed magnetic material column MML1 of the read operation can be performed.

Figure 3:
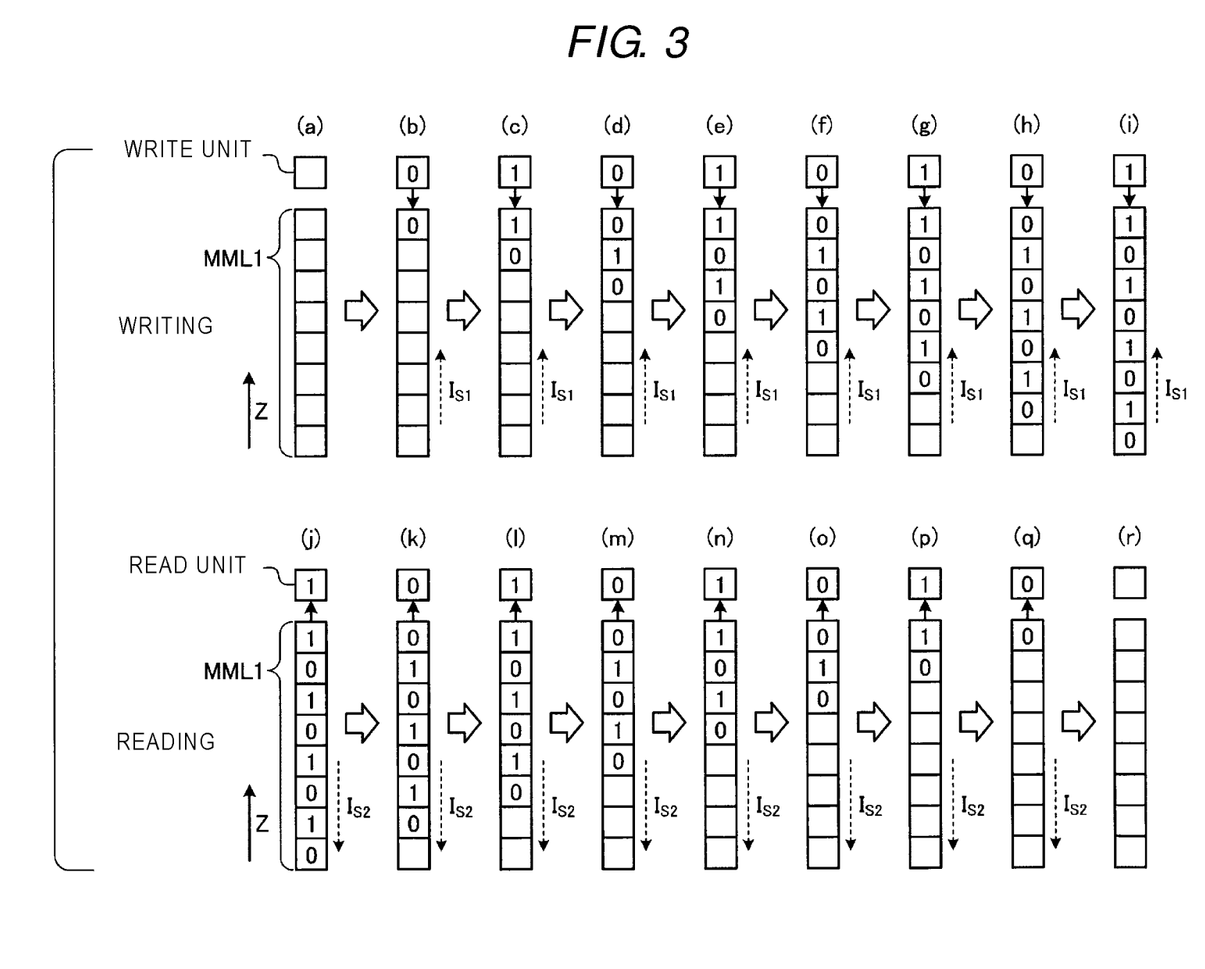
FIG. 3 depicting aspects of a write operation and a read operation in an embodiment.

FIG. 3 is a diagram conceptually showing sequences in the writing and reading of a magnetic material column MML1.

First, a write sequence will be described. When "0" is to be written, as shown in FIG. 3 part (b), by a write unit when the magnetic material column MML1 has the state shown in FIG. 3 part (a) before the start of writing, then "0" is written in a first magnetic domain of the magnetic material column MML1. A shift current Is1 in the +Z direction is applied, and what was initially the first magnetic domain is shifted to a second position. Next, as shown in FIG. 3 part (c), when "1" is next to be written by the write unit, the shift current Is1 in the +Z direction is applied, the "0" in the first magnetic domain is shifted down to the second magnetic domain, and "1" is written in the first magnetic domain. As shown in FIG. 3 part (d), when "0" is next to be written by the write unit, the shift current Is1 in the +Z direction is applied, the "0" in the second magnetic domain is shifted to a third magnetic domain, the "1" in the first magnetic domain is shifted to the second magnetic domain, and "0" is written in the first magnetic domain.

Similarly, in the subsequent writings, as shown in FIG. 3 parts (e) to (i), the shift current Is1 in the +Z direction is applied, and the previously written data on the magnetic material column MML1 is shifted away from the writing position, and data is again written to the first magnetic domain.

Next, a read sequence will be described. FIG. 3 parts (j) to (r) depict a reading of the magnetic material column MML1. In reading, as shown in FIG. 3 part (j), a read current is applied to the magnetic material column MML1, and the "1" value presently stored in the first magnetic domain of the magnetic material column MML1 is read by a read unit.

A shift current Is2 in the −Z direction is applied to the magnetic material column MML1, and magnetic domains are shifted toward the reading position. Accordingly, for example, "0" in the second magnetic domain before the first reading is shifted to the first magnetic domain, and "1" in the third magnetic domain before the first reading is shifted to the second magnetic domain. Subsequently, as shown in FIG. 3 part (k), the read current is again applied to the magnetic material column MML1, and "0" now stored in the first magnetic domain is read by the read unit.

As shown in FIG. 3(*k*), the shift current Is2 in the −Z direction is applied to the magnetic material column MML1, and the magnetic domains are again shifted toward the reading position. Accordingly, in the reading shown in FIG. 3(*k*), "1" in the second magnetic domain is shifted to the first magnetic domain, and "0" in the third magnetic domain is shifted to the second magnetic domain. Subsequently, as shown in FIG. 3(*l*), when the read current is applied to the magnetic material column MML1, the "1" value presently stored in the first magnetic domain is read by the read unit.

Similarly, in the subsequent readings, as shown in FIG. 3 parts (m) to (r), the shift current Is2 in the −Z direction is applied, and each magnetic domain in the magnetic material column MML1 is shifted toward the reading position, and the data presently stored in the first magnetic domain is read out.

Figure 4:
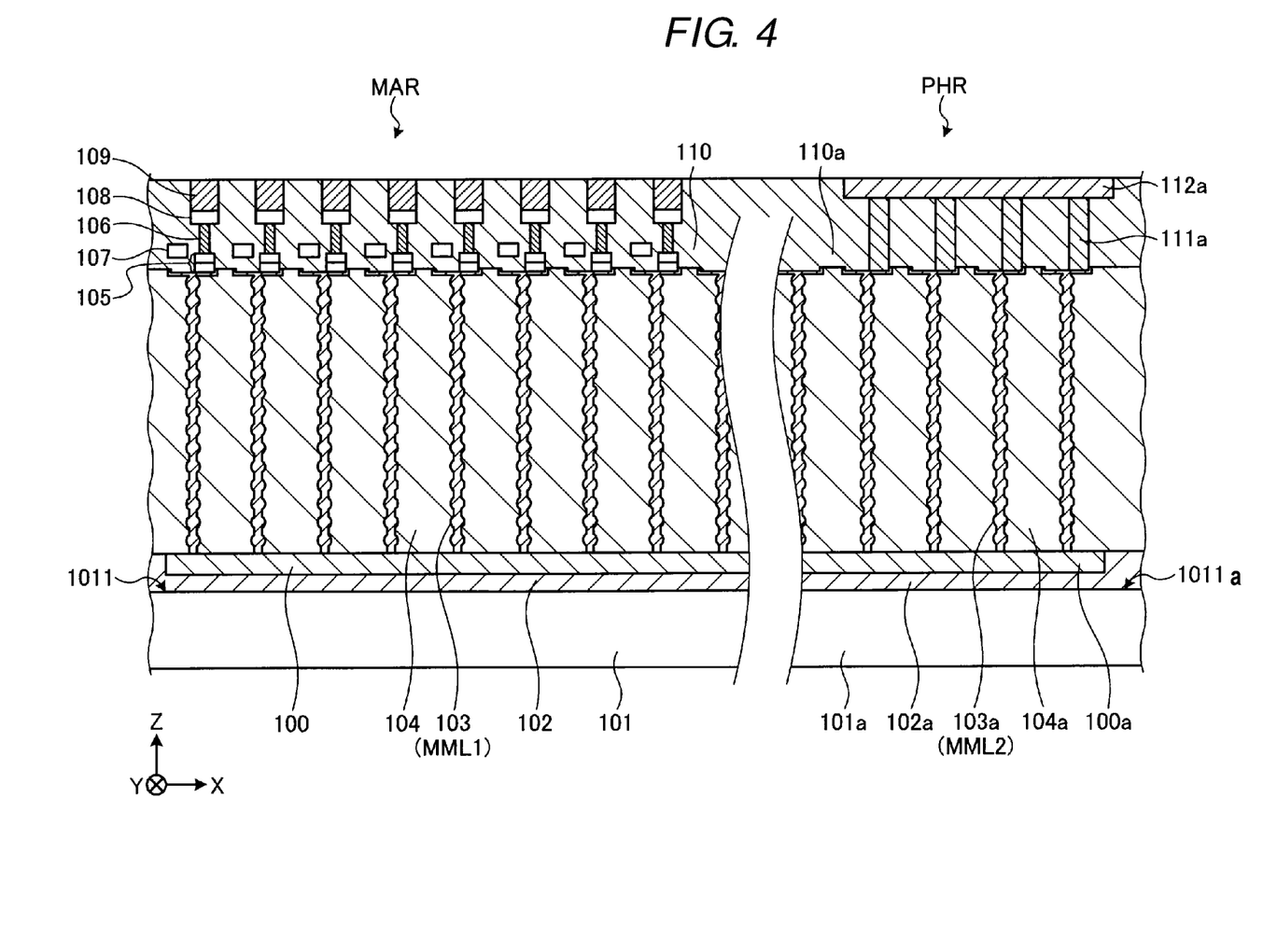
FIG. 4 is a cross-sectional view of a memory cell array region and a peripheral region in an embodiment.
Figure 5:
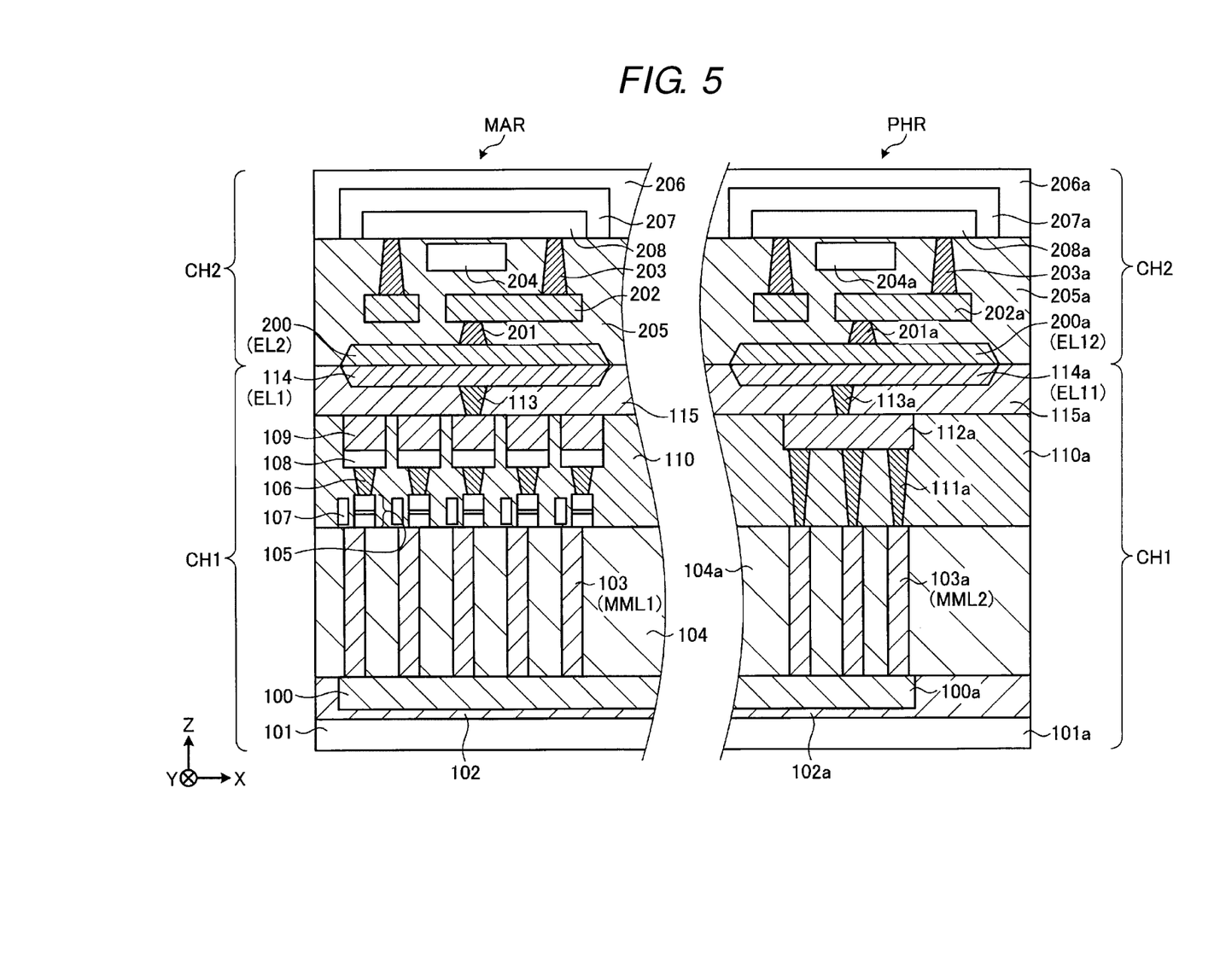
FIG. 5 is a cross-sectional view depicting multiple chips as bonded in an embodiment.

The circuit configuration shown in FIG. 2 may be implemented as shown in FIG. 4, for example. FIG. 4 is a cross-sectional view showing a configuration of the memory cell array region MAR and the peripheral region PHR. FIG. 5 is a cross-sectional view showing a configuration in which different chips or substrates have been bonded to each other.

As shown in FIG. 4, in the memory cell array region MAR, a conductive line 100 is disposed on the +Z side of the surface 1011 of substrate 101 via an interlayer insulating film 102. The substrate 101 may be made of a material composed mainly of a semiconductor (for example, silicon). The interlayer insulating film 102 may be made of a material composed mainly of an insulator such as an oxide of a semiconductor material (for example, silicon oxide). The conductive line 100 may be made of a material composed mainly of a conductor (for example, aluminum or tungsten). The conductive line 100 is patterned to function as the source line SL and has a line shape that extends in the X direction. Although not shown in the cross-section view, a plurality of conductive lines 100 are arranged in a direction (Y direction) along the surface 1011 (see FIG. 2).

In the peripheral region PHR, a conductive line 100a is disposed on the +Z side of a surface 1011a of a substrate 101a via an interlayer insulating film 102a. The substrate 101a may be made of a material composed mainly of a semiconductor (for example, silicon). The interlayer insulating film 102a can be made of a material composed mainly of an insulator (for example, silicon oxide). The conductive line 100a may be made of a material composed mainly of a conductor (for example, aluminum or tungsten). The conductive line 100a is patterned to function as the source line SL and has a line shape that extends in the memory cell array region MAR in the −X direction. The conductive lines 100a are physically and electrically connected to the conductive lines 100. Although not shown in the cross-sectional view, a plurality of conductive lines 100a are arranged in a direction (Y direction) along the surface 1011a of the substrate 101a (see FIG. 2). In the memory cell array region MAR, a plurality of columnar bodies 103 and an interlayer insulating film 104 are disposed on the +Z side of the plurality of conductive lines 100 and the interlayer insulating film 102. The columnar body 103 may comprise a magnetic material, for example, a magnetic alloy containing at least one element selected from the group consisting of iron (Fe), cobalt (Co), nickel (Ni), manganese (Mn), and chromium (Cr). The interlayer insulating film 104 may comprise a metal oxide, for example, alumina. The columnar bodies 103 function as the magnetic material columns MML1, and are arranged in the X direction and also in the Y direction (see FIG. 2). The dimension (diameter) of each columnar body 103 in the X and Y directions may change along the Z direction or may have a shape in which a narrower portion is periodically alternated with a wider portion along in the Z direction. Accordingly, when the columnar body 103 functions as the magnetic material column MML1, positions of the magnetic domains within the magnetic material column MML1 can be stably determined before and after the shift operation.

Similarly, in the peripheral region PHR, a plurality of columnar bodies 103a and an interlayer insulating film 104a are disposed on the +Z side of the plurality of conductive lines 100a and the interlayer insulating film 102a. The columnar body 103a may be comprised of a magnetic material, for example, a magnetic alloy containing at least one element selected from the group consisting of iron (Fe), cobalt (Co), nickel (Ni), manganese (Mn), and chromium (Cr). The columnar body 103a may include the same material as the columnar body 103 of the memory cell array region MAR. The columnar body 103a may a height equal to that of the columnar body 103 of the memory cell array region MAR. The interlayer insulating film 104a may comprise a metal oxide, for example, alumina. The plurality of columnar bodies 103a function as magnetic material columns MML2, and are arranged in the X direction and in the Y direction (see FIG. 2). Each columnar body 103a may have a shape corresponding to that of the columnar body 103 of the memory cell array region MAR. The dimension (diameter) of each columnar body 103a in the X and Y directions may vary along the Z direction, or may have a shape in which a narrower portion is periodically alternated with a wider portion along the Z direction. The columnar body 103a functions as a magnetic material column MML2. The interlayer insulating film 102a may be the same material as the interlayer insulating film 102.

A structure including the columnar bodies 103 and 103a and the interlayer insulating films 104 and 104a may be formed by a wet etching process according to an anodic oxidation method. For example, a metal substrate made of aluminum or the like is prepared, the metal substrate is placed in an electrolytic solution (for example, sulfuric acid, oxalic acid, phosphoric acid) as an anode, and the metal substrate is energized. At this time, an anode portion in the metal substrate is oxidized into metal ions and dissolves. The metal ions combine with oxygen in the liquid to form a metal oxide and grow on the anode surface of the metal substrate. That is, the metal oxide (grows on the metal substrate. As dissolution and growth proceed, alumina forms minute holes that are aligned to the aluminum surface of the anode. The dimensions of the holes are determined by aluminum purity, voltage, electrolytic solution and processing time. For example, when an aluminum substrate having a purity of 99.995% or more is processed with sulfuric acid at several tens of volts for several tens of minutes, holes having a diameter of 20 nm and a depth of 10 µm are arranged at a pitch of 60 nm without branching between or towards adjacent holes.

That is, the structure including the plurality of columnar bodies 103 and the interlayer insulating film 104 in the memory cell array region MAR and the structure including the plurality of columnar bodies 103a and the interlayer insulating film 104a in the peripheral region PHR are structures suitable for being formed in a common process collectively by a wet etching process according to the anodic oxidation method adopted.

In the memory cell array region MAR, an MTJ element 105, a plug 106, a selection element 108, and a conductive line 109 are stacked in this order on the +Z side of each columnar body 103, and a conductive line 107 is disposed near a +Z side end portion of each columnar body 103 via an interlayer insulating film 110. The interlayer insulating film 110 may be made of a material composed mainly of an insulator such as a semiconductor oxide (for example, silicon oxide). The MTJ element 105 in contact with the +Z side end of the columnar body 103 functions as the MTJ element 11, and may be in the form of a stack of several different layers of different materials providing a magnetoresistance effect. The plug 106 extends in the Z direction and may be comprised of a conductor (for example, tungsten). The selection element 108 provides the functions of the selector 12 (see FIG. 2) and may be in the form of a stack of different material layers that permit a change of conductance across the selection element 108 according to a control voltage or the like. The conductive line 109 may be comprised of a conductor (for example, aluminum). The conductive line 109 is patterned to function as the bit line BL and is arranged in the X direction via the interlayer insulating film 110 and extends as a line in the Y direction. The conductive line 107 may comprise a conductor (for example, aluminum or tungsten). The conductive line 107 is patterned to function as the field line FL and is arranged in the X direction via the interlayer insulating film 110 and extends as line in the Y direction.

In the peripheral region PHR, a plug 111a and a conductive line 112a are stacked in order on the +Z side of each columnar body 103a. The plug 111a comprises a conductor (for example, tungsten). The plug 111a is in contact with a +Z side end of the columnar body 103a, extends in the Z direction, and is in contact with the −Z side of the conductive line 112a. A plurality of plugs 111a are arranged in the X direction via an interlayer insulating film 110a. The conductive line 112a may comprise a conductor (for example, aluminum or tungsten). The conductive line 112a functions as the connection line CL, extends in the X direction, and is electrically connected to a plurality of plugs 111a.

As shown in FIG. 5, the magnetic memory 1 may include at least chips CH1 and CH2 bonded together. FIG. 5 shows a state where the chips CH1 and CH2 have been bonded to one another. Here, the chip CH1 is a memory chip may also be considered to have the configuration depicted in FIG. 4. The chip CH1 may also have the following configurations in addition to the specific configuration depicted in FIG. 4.

In the memory cell array region MAR, a plug 113 and a conductive pad 114 are stacked in this order on the +Z side of the conductive line 109. An interlayer insulating film 115 is disposed around the plug 113 and the conductive pad 114. The interlayer insulating film 115 may be made of a material composed mainly of an insulator such as a semiconductor oxide (for example, silicon oxide). The plug 113 may be made of a material composed mainly of a conductor (for example, tungsten). The plug 113 is in contact with a +Z side of the conductive line 109, extends in the Z direction, and is in contact with a −Z side of the conductive pad 114. The conductive pad 114 is patterned to function as the electrode EL1, and may be made of a material composed mainly of a conductor (for example, copper). In FIG. 5, one plug 113 and one conductive pad 114 is depicted for only one conductive line 109; however, a plug 113 and a conductive pad 114 corresponding to other conductive lines 109 may also be provided similarly, though this is not depicted in this cross-section.

In the peripheral region PHR, a plug 113a and a conductive pad 114a are stacked in this order on the +Z side of a conductive line 112a. An interlayer insulating film 115a is disposed around the plug 113a and the conductive pad 114a. The interlayer insulating film 115a may be made of a material composed mainly of an insulator such as a semiconductor oxide (for example, silicon oxide). The plug 113a may be made of a material composed mainly of a conductor (for example, tungsten). The plug 113a is in contact with a +Z side of the conductive line 112a, extends in the Z direction, and is in contact with a −Z side of the conductive pad 114a. The conductive pad 114a is patterned to function as the electrode EL11, and may be made of a material composed mainly of a conductor (for example, copper). In FIG. 5, a plug 113a and a conductive pad 114a corresponding to only one conductive line 112a is illustrated; however, a plug 113a and a conductive pad 114a corresponding to another conductive line 112a may also be provided similarly, though not shown in this cross-section.

The chip CH2 is a CMOS chip has a configuration corresponding to electrode patterns on the chip CH1. That is, the chip CH2 has conductive pads 200 and 200a at positions that will overlap the conductive pads 114 and 114a when the chip CH2 is bonded to the chip CH1.

For the memory cell array region MAR, the conductive pad 200 and a plug 201 are stacked in this order on the +Z side of the conductive pad 114. A +Z side surface of the conductive pad 114 is in contact with a −Z side surface of the conductive pad 200. The conductive pad 200 is patterned to function as the electrode EL2 and may be made of a material composed mainly of a conductor (for example, copper). The plug 201 is in contact with a +Z side of the conductive pad 200, extends in the Z direction, and is in contact with a −Z side of the conductive film 202. The plug 201 may be made of a material composed mainly of a conductor (for example, copper and tungsten). The conductive film 202 may be made of a material composed mainly of a conductor (for example, copper and aluminum). The conductive film 202 is connected to a plug 203. The plug 203 may be made of a material composed mainly of a conductor (for example, tungsten). The plug 203 extends in the Z direction and is connected to a semiconductor region 208 in a well region 207 of a substrate 206. An electrode film 204 may be disposed on the −Z side (backside) of the substrate 206. This configuration including the conductive film 202, the plug 203, the semiconductor region 208 and the electrode film 204 can function as a part of the first control circuit 51.

In the peripheral region PHR, the conductive pad 200a and a plug 201a are stacked in this order on the +Z side of the conductive pad 114a. A +Z side surface of the conductive pad 114a is in contact with a −Z side surface of the conductive pad 200a. The conductive pad 200a is patterned to function as the electrode EL2 and may be made of a material composed mainly of a conductor (for example, copper). The plug 201a is in contact with a +Z side of the conductive pad 200a, extends in the Z direction, and is in contact with a −Z side of a conductive film 202a. The plug 201a may be made of a material composed mainly of a conductor (for example, tungsten). The conductive film 202a may be made of a material composed mainly of a conductor (for example, copper and aluminum). The conductive film 202a is connected to a plug 203a. The plug 203a may be made of a material composed mainly of a conductor (for example, copper and tungsten). The plug 203a extends in the Z direction and is connected to a semiconductor region 208a in a well region 207a of a substrate 206a. A predetermined electrode film 204a may be disposed on the−Z side of the substrate 206a. The configuration including the conductive film 202a, the plug 203a, the semiconductor region 208a and the electrode film 204a can function as a part of the second control circuit 52.

In FIG. 5, although columnar bodies 103 and 103a are depicted as a substantially fixed dimension columnar shape, each of bodies 103 and 103a may have a shape in which a narrower portion alternates with a wider portion along the Z direction as is shown in FIG. 4.

As described above, the magnetic memory 1 has a plug-like structure in the peripheral region PHR formed by the magnetic material column MML2. The magnetic material columns MML2 in the peripheral region PHR and the magnetic material columns MML1 in the memory cell array region MAR can be formed by a common process. Accordingly, the magnetic memory 1 can be configured at lower cost.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A magnetic memory, comprising:
   a conductive line that extends in a first direction along a substrate;
   a first columnar body in a memory cell array region of the substrate, extending in a second direction from the substrate, a first end of the first columnar body contacting the conductive line, the first columnar body comprising a first magnetic material and a plurality of magnetic domains adjacent to one another along a length of the first columnar body in the second direction; and
   a second columnar body in a peripheral region of the substrate, extending in the second direction from the substrate, a first end of the second columnar body contacting the conductive line, and a second end of the second columnar body connected to a control circuit, the second columnar body comprising the first magnetic material.

2. The magnetic memory according to claim 1, wherein the second columnar body comprises a plurality of magnetic domains adjacent to one another along a length of the second columnar body in the second direction.

3. The magnetic memory according to claim 2, wherein the first columnar body and the second columnar body comprise alternating narrow and wide column widths.

4. The magnetic memory according to claim 1, further comprising:
   a first insulating film surrounding each of the first columnar body and the second columnar body.

5. The magnetic memory according to claim 4, wherein the first insulator film is a metal oxide.

6. The magnetic memory according claim 1, further comprising:
   a first electrode pad electrically connected to the second end of the second columnar body, wherein
   the control circuit is connected to the second columnar body via the first electrode pad.

7. The magnetic memory according to claim 6, wherein the substrate comprises a first chip and the control circuit is in a second chip mounted on the first chip such that the first electrode pad contacts a second electrode pad on the second chip.

8. The magnetic memory according to claim 1, wherein the substrate comprises a first chip and the control circuit is in a second chip bonded to the first chip.

9. The magnetic memory according to claim 1, further comprising:
   a bit line connected to the control circuit;
   a selector element connected to the bit line and in a conductance path between the bit line and the first columnar body;
   a magnetic tunnel junction element on a second end of the first columnar body, the magnetic tunnel junction element connected between the selector element and the second end of the first columnar body; and
   a field line passing near the second end of the first columnar body but not connected to the second end, the field line being connected to the control circuit.

10. The magnetic memory according to claim 9, further comprising:
    a first electrode connected to the control circuit; and
    a contact plug on the second end of the second columnar body and electrically connecting the second columnar body to the first electrode.

11. The magnetic memory according to claim 1, wherein the first and second columnar bodies consist of the first magnetic material,
    each of the first and second columnar bodies comprises a structure including alternating wide and narrow column widths along column lengths in the second direction, and
    each of the first and second columnar bodies have a same height from the substrate in the second direction.

12. The magnetic memory according to claim 1, further comprising:
    a plurality of first columnar bodies in the memory cell array region; and
    a plurality of second columnar bodies in the peripheral region.

13. A magnetic memory device, comprising:
    a control circuit;
    a plurality of conductive lines that extends in a first direction along a substrate;
    a plurality of first columnar bodies in a memory cell array region of the substrate, each first columnar body extending in a second direction from the substrate, a first end of each first columnar body contacting one of the plurality of conductive lines, each first columnar body comprising a first magnetic material and a plurality of magnetic domains adjacent to one another along a length of the first columnar body in the second direction; and
    a plurality of second columnar bodies in a peripheral region of the substrate, each second columnar body extending in the second direction from the substrate and having a first end contacting one of the plurality of conductive lines and a second end connected to the control circuit, each second columnar body comprising the first magnetic material, wherein
    the control circuit is configured to supply a shift current to the plurality of first columnar bodies via a conductance path including at least one of the plurality of second columnar bodies.

14. The magnetic memory device according to claim 13, wherein each second columnar body comprises a plurality of magnetic domains adjacent to one another along a length of the second columnar body in the second direction.

15. The magnetic memory device according to claim 13, wherein the substrate comprises a first chip and the control circuit is in a second chip bonded to the first chip.

16. The magnetic memory device according to claim 13, further comprising:
    a magnetic tunnel junction element on a second end of each first columnar body.

17. The magnetic memory device according to claim 16, further comprising:
    a plurality of bit lines connected to the control circuit; and
    a selector element between each magnetic tunnel junction element and a bit line.

18. The magnetic memory device according to claim 13, further comprising:

a plurality of field lines, each field line passes near a second end of at least one first columnar body.

19. A magnetic memory device, comprising:
a control circuit;
a conductive line that extends in a first direction along a substrate;
a first columnar body in a memory cell array region of the substrate, extending in a second direction from the substrate, a first end of the first columnar body contacting the conductive line, the first columnar body comprising a first magnetic material and a plurality of magnetic domains adjacent to one another along a length of the first columnar body in the second direction;
a second columnar body in a peripheral region of the substrate, extending in the second direction from the substrate, a first end of the second columnar body contacting the conductive line, and a second end of the second columnar body connected to the control circuit, the second columnar body comprising the first magnetic material;
a magnetic tunnel junction element on a second end of the first columnar body;
a field line connected to the control circuit and passing near the second end of the first columnar body; and
a bit line connected to the magnetic tunnel junction element, wherein
the control circuit is configured to write data to the first columnar body by application of voltage to the field line and to shift a domain of the first column body in the second direction by application of a current to the first columnar body via conductance path including the second columnar body and the conductive line.

20. The memory device according to claim 19, wherein the substrate comprises a first chip and the control circuit is in a second chip bonded to the first chip.

21. A magnetic memory, comprising:
a conductive line that extends in a first direction along a substrate;
a first columnar body in a memory cell array region of the substrate, extending in a second direction from the substrate, a first end of the first columnar body contacting the conductive line, the first columnar body comprising a first magnetic material; and
a second columnar body in a peripheral region of the substrate, extending in the second direction from the substrate, a first end of the second columnar body contacting the conductive line, and a second end of the second columnar body connected to a control circuit, the second columnar body comprising the first magnetic material.

22. The magnetic memory according to claim 21, wherein the first columnar body and the second columnar body comprise alternating narrow and wide column widths.

* * * * *